United States Patent
Kimura

(10) Patent No.: US 9,568,567 B2
(45) Date of Patent: Feb. 14, 2017

(54) DISTRIBUTION ANALYSIS DEVICE

(75) Inventor: Kenjiro Kimura, Kobe (JP)

(73) Assignee: NATIONAL UNIVERSITY CORPORATION KOBE UNIVERSITY, Hyogo (JP)

(*) Notice: Subject to any disclaimer, the term of this patent is extended or adjusted under 35 U.S.C. 154(b) by 544 days.

(21) Appl. No.: 14/115,650

(22) PCT Filed: May 1, 2012

(86) PCT No.: PCT/JP2012/002951
§ 371 (c)(1),
(2), (4) Date: Nov. 5, 2013

(87) PCT Pub. No.: WO2012/153496
PCT Pub. Date: Nov. 15, 2012

(65) Prior Publication Data
US 2014/0081584 A1    Mar. 20, 2014

(30) Foreign Application Priority Data
May 9, 2011  (JP) ................................. 2011-104143

(51) Int. Cl.
*G01R 33/10* (2006.01)
*G01R 33/12* (2006.01)
(Continued)

(52) U.S. Cl.
CPC ........... *G01R 33/10* (2013.01); *G01R 33/0064* (2013.01); *G01R 33/12* (2013.01); *G06F 17/13* (2013.01)

(58) Field of Classification Search
CPC ...... A61N 1/40; A61N 2/006; A61N 1/36014; A61N 2/008
(Continued)

(56) References Cited

U.S. PATENT DOCUMENTS

| | | | |
|---|---|---|---|
| 5,625,578 A | 4/1997 | Du Cloux et al. | |
| 6,377,041 B1 | 4/2002 | Jones, Jr. et al. | |

(Continued)

FOREIGN PATENT DOCUMENTS

| | | |
|---|---|---|
| AT | 501 845 | 8/2008 |
| CN | 1284648 | 2/2001 |

(Continued)

OTHER PUBLICATIONS

Extended European Search Report mailed on Dec. 9, 2015 in corresponding European Application No. 12781659.3.

(Continued)

*Primary Examiner* — Edward Raymond
(74) *Attorney, Agent, or Firm* — Wenderoth, Lind & Ponack, L.L.P.

(57) ABSTRACT

A distribution analysis device analyzes a distribution of a field having a property satisfying the Laplace equation, and includes: an obtainment unit that obtains measurement data indicating the distribution of the field measured through a sensor sensing area, the sensor sensing area being an area that moves in a measurement area where the distribution of the field is measured and being an area in which the field is sensed as an aggregate; and a calculation unit that calculates analysis data indicating the distribution of the field with a higher resolution than the measurement data, using an arithmetic expression that is obtained by deriving a solution of the Laplace equation using a boundary condition that an integral of the solution of the Laplace equation in a finite interval corresponding to a size of the sensor sensing area matches the measurement data.

8 Claims, 8 Drawing Sheets

(51) Int. Cl.
*G06F 17/13* (2006.01)
*G01R 33/00* (2006.01)

(58) Field of Classification Search
USPC .............................. 702/57, 60–67, 182–185
See application file for complete search history.

(56) References Cited

U.S. PATENT DOCUMENTS

| | | | |
|---|---|---|---|
| 6,714,008 | B1 | 3/2004 | Holmes et al. |
| 6,887,365 | B2 | 5/2005 | Naughton |
| 7,214,303 | B2 | 5/2007 | Naughton |
| 7,462,270 | B2 | 12/2008 | Naughton |
| 8,536,862 | B2 * | 9/2013 | Kimura .................. B82Y 35/00 324/244 |
| 2004/0113621 | A1 | 6/2004 | Naughton |
| 2005/0241375 | A1 | 11/2005 | Naughton |
| 2007/0235340 | A1 | 10/2007 | Naughton |
| 2010/0219819 | A1 | 9/2010 | Kimura et al. |

FOREIGN PATENT DOCUMENTS

| | | |
|---|---|---|
| JP | 06-325119 | 11/1994 |
| JP | 09-160903 | 6/1997 |
| JP | 09-229727 | 9/1997 |
| JP | 2000-039414 | 2/2000 |
| JP | 2000-275206 | 10/2000 |
| JP | 2006-501484 | 1/2006 |
| JP | 2006-031413 | 2/2006 |
| JP | 2006-226978 | 8/2006 |
| JP | 2007-114104 | 5/2007 |
| JP | 2007-271465 | 10/2007 |
| WO | 2004/038430 | 5/2004 |
| WO | 2007/044076 | 4/2007 |
| WO | 2008/123432 | 10/2008 |

OTHER PUBLICATIONS

Liang, Hu et al., "A Method Based on Measured Boundary Conditions for Reconstructing the Magnetic Field Distribution of an Electromagnetic Mechatronic System", IEEE / ASME Transactions on Mechatronics, IEEE Service Center, Piscataway, NJ, US, vol. 15, No. 4, Aug. 1, 2010 (Aug. 1, 2010), pp. 595-602, XP011345369, ISSN: 1083-4435, DOI: 10.1109/TMTECH.2009.2030795.

International Search Report issued Aug. 14, 2012 in International (PCT) Application No. PCT/JP2012/002951.

Ryousuke Kawai et al, A computational method for quantitative nondestructive evaluation using superconducting quantum interference devices, The Japan Society of Mechanical Engineers computational dynamics lecture collection of papers vol. 13 t h p. 415-416(Nov. 27, 2000) (with English translation).

N. Burais et al, Electromagnetic field Formulation for Eddy Current Calculations in Nondestructive Testing Systems, I E EE Trans Magn vol. 18 No. 6 p. 1058-1060(Nov. 1982).

Frederick Felt, Analysis of a Microcircuit Failure using SQUID and MR Current Imaging, Proceedings of the 31st International Symposium for Testing and Failure Analysis (169-177) Oct. 2005.

Benaiah D. S. et al, "Magnetic current imaging with magnetic tunnel junction sensors: case study and analysis", Proceedings of the 2006 International Symposium for Testing and Failure Analysis (2006). [http://www.micromagnetics.com/pdfs/schrag_06_istfa_mtjs_case_study_and_comparison.pdf] [http://www.micromagnetics.com/publications_page.html].

Bradley J. Roth et al, Using a magnetometer to image a two-dimensional current distribution, Journal of Applied Physics, vol. 65, Issue 1, Jan. 1, 1989, p361-372.

RMD Magnetic Vision System for IC Inspection, obtained prior to May 9, 2011.

Magnetic Imaging to Detect a Serpentine Stucture in an Integrated Circuit, obtained prior to May 9, 2011.

L.A. Knauss et al, Current Imaging using Magnetic Field Sensors, Microelectronics Failure Analysis, Desk Reference Sixth Edition(301-309), Oct. 2011.

* cited by examiner

DISTRIBUTION ANALYSIS DEVICE

TECHNICAL FIELD

The present invention relates to a distribution analysis device that analyzes a field having a property satisfying the Laplace equation.

BACKGROUND ART

Conventionally, a spatial distribution of a magnetic field (hereafter also referred to as "magnetic field distribution") is utilized in various applications such as locating an abnormal electric current path in an electronic component or examining a disease part of a human body. In measurement of such a magnetic field distribution, a superconducting quantum interference device, a magnetoresistive sensor, or the like is used as a magnetic field sensor. The superconducting quantum interference device is also referred to as "SQUID element".

Magnetic force microscopy (MFM) may also be used to obtain a magnetic field distribution. A magnetic field sensor formed by coating a sharpened silicon tip with a magnetic thin film is used for an MFM probe. Such a probe is also referred to as "magnetic probe". Patent Literature (PTL) 1 proposes a structure of using a carbon nanotube magnetic probe as the MFM probe. PTL 2 describes a method of measuring a three-dimensional distribution of a magnetic field, an electric field, a thermal field, or the like in a three-dimensional free space.

In the method described in PTL 2, the Laplace equation which is a fundamental equation of a static magnetic field is exactly solved using, as a boundary condition, a two-dimensional magnetic field distribution and a two-dimensional distribution of the gradient of the magnetic field obtained in a specific measurement plane, thus calculating a three-dimensional magnetic field distribution in a free space around the measurement plane. The gradient of the magnetic field mentioned here means a gradient of a magnetic field in a direction normal to the measurement plane. The free space around the measurement plane includes both a three-dimensional space above the measurement plane and a three-dimensional space below the measurement plane.

With the method described in PTL 2, a structure of a source of a magnetic field (magnetic field source) can be imaged using magnetic field distribution measurement data obtained in an area away from the magnetic field source. The image showing the structure of the magnetic field source is available, for example, for medical diagnosis or electronic component failure analysis.

In the case of analyzing the magnetic field source in the space below the measurement plane, an electronic circuit and a mechanical component for signal processing for the magnetic field sensor are typically present in the space above the measurement plane. These are not an object to be measured, but are a magnetic field source.

In the method described in PTL 2, the distribution of the field can be exactly analyzed even in the case where magnetic field sources are included in both of the spaces above and below the measurement plane.

CITATION LIST

Patent Literature

[PTL 1]
Japanese translation of PCT International Application Publication No, 2006-501484
[PTL 2]
WO 2008/123432

SUMMARY OF INVENTION

Technical Problem

The spatial resolution in the measurement of the magnetic field distribution depends on the size of a coil used in the SQUID element or the size of the magnetoresistive sensor. Miniaturizing such a magnetic field sensor enables the magnetic field distribution to be imaged with a higher spatial resolution. However, there is actually a limit to the miniaturization of the magnetic field sensor. For example, it is hard to manufacture a magnetic field sensor of 100 nm or less in size. Besides, a miniaturized magnetic field sensor outputs a small electric signal from its sensing area, and suffers a low signal to noise ratio (S/N).

In view of this, the present invention has an object of providing a distribution analysis device that is capable of analyzing a distribution of a magnetic field, an electric field, or the like with a higher spatial resolution even in the case where a sensor sensing area is large.

Solution to Problem

To achieve the object stated above, a distribution analysis device according to an aspect of the present invention is a distribution analysis device that analyzes a distribution of a field having a property satisfying the Laplace equation, the distribution analysis device including: an obtainment unit that obtains measurement data indicating the distribution of the field measured through a sensor sensing area, the sensor sensing area being an area that moves in a measurement area where the distribution of the field is measured and being an area in which the field is sensed as an aggregate; and a calculation unit that calculates analysis data indicating the distribution of the field with a higher resolution than the measurement data, using an arithmetic expression that is obtained by deriving a solution of the Laplace equation using a boundary condition that an integral of the solution of the Laplace equation in a finite interval corresponding to a size of the sensor sensing area matches the measurement data.

In this way, the distribution analysis device can calculate the analysis data using the arithmetic expression that is obtained by deriving the solution of the Laplace equation using the measurement data as the boundary condition.

That is, the distribution analysis device can theoretically exactly calculate the analysis data, by directly assigning the measurement data to the arithmetic expression. Hence, even in the case where the sensor sensing area is large, the distribution analysis device can analyze a magnetic field, an electric field, or the like in an area smaller than the size of the sensor sensing area.

Moreover, the obtainment unit may obtain the measurement data indicating the distribution of the field that is any of a magnetic field, an electric field, and a thermal field, wherein the calculation unit calculates the analysis data indicating the distribution of the field.

In this way, the distribution analysis device can analyze the spatial distribution of the magnetic field or the like with a high resolution. The analyzed spatial distribution of the magnetic field or the like is available for various applications such as electronic component failure analysis, medical diagnosis, and concrete rebar corrosion inspection.

Moreover, the obtainment unit may obtain the measurement data indicating the distribution of the field measured through the sensor sensing area that intersects a measurement plane, the measurement plane being a plane perpendicular to a predetermined Z direction, wherein the calculation unit calculates the analysis data, using the arithmetic expression that is obtained by deriving the solution of the Laplace equation using the boundary condition that the integral of the solution of the Laplace equation in the finite interval corresponding to the size of the sensor sensing area in the Z direction matches the measurement data.

In this way, the distribution analysis device can calculate the analysis data that more accurately indicates the spatial distribution of the magnetic field, the electric field, or the like in the measurement plane, even in the case where the sensor sensing area is large in the Z direction.

Moreover, in the case where, in a three-dimensional space including mutually perpendicular X, Y, and Z directions: z denotes a coordinate value in the Z direction; $k_x$ denotes a wavenumber in the X direction; $k_y$ denotes a wavenumber in the Y direction; $\Delta x$ denotes the size of the sensor sensing area in the X direction; $\Delta z$ denotes the size of the sensor sensing area in the Z direction; $\phi_m(x, y, z)$ denotes the measurement data when the coordinate value in the Z direction is z; f(x, y) denotes the measurement data when z in $\phi_m(x, y, z)$ is 0; g(x, y) denotes a function obtained by assigning 0 to z in a function obtained by differentiating $\phi_m(x, y, z)$ with respect to z;

$$\tilde{f}(k_x, k_y) \qquad [\text{Math. 1}]$$

denotes a function as a result of Fourier transforming f(x, y) in the X and Y directions; and $$\tilde{g}(k_x, k_y) \qquad [\text{Math. 2}]$$

denotes a function as a result of Fourier transforming g(x, y) in the X and Y directions, the calculation unit may calculate the analysis data using $$\frac{k_x\sqrt{k_x^2 + k_y^2}\cosh\left(z\sqrt{k_x^2 + k_y^2}\right)\tilde{f}(k_x, k_y) + k_x\sinh\left(z\sqrt{k_x^2 + k_y^2}\right)\tilde{g}(k_x, k_y)}{4\sin(\Delta x k_x/2)\sinh\left(\Delta z\sqrt{k_x^2 + k_y^2}/2\right)} \qquad [\text{Math. 3}]$$

as the arithmetic expression.

In this way, the distribution analysis device can calculate the analysis data using the arithmetic expression. The use of the arithmetic expression enables the distribution analysis device to obtain, using the sensor sensing area of the finite size, data corresponding to the case where the size of the sensor sensing area is infinitely small.

Moreover, the obtainment unit may obtain the measurement data indicating the distribution measured through the sensor sensing area that rotates about a line parallel to a predetermined Z direction.

In this way, the distribution analysis device can obtain the measurement data from various angles.

Moreover, in the case where: a three-dimensional free space is represented by cylindrical coordinates using z that denotes a coordinate value in the Z direction, θ that denotes an angular coordinate, and p that denotes a radius distance; k denotes a wavenumber in a P direction which is a direction of the radius distance; $\Delta z$ denotes the size of the sensor sensing area in the Z direction; $g_{me}(p, \theta, z)$ denotes the measurement data when the coordinate value in the Z direction is z; $f_m(k, \theta)$ denotes a function as a result of Fourier transforming $g_{me}(p, \theta, z)$ in the P direction when z in $g_{me}(p, \theta, z)$ is 0; and $g_m(k, \theta)$ denotes a function as a result of Fourier transforming, in the P direction, a function obtained by assigning 0 to z in a function obtained by differentiating $g_{me}(p, \theta, z)$ with respect to z, the calculation unit may calculate the analysis data using $$\frac{k\cosh(kz)f_m(k, \theta) + \sinh(kz)g_m(k, \theta)}{2\sinh(k\Delta z/2)} \qquad [\text{Math. 4}]$$

as the arithmetic expression.

In this way, the distribution analysis device can analyze, from the measurement data indicating the distribution measured through the sensor sensing area of the finite size, the spatial distribution of the magnetic field or the like much smaller than the size of the sensor sensing area.

Moreover, the obtainment unit may multiply a value of the field sensed in the sensor sensing area by a window function, and obtain the measurement data including the value multiplied by the window function.

In this way, the distribution analysis device can obtain the measurement data indicating the appropriate distribution locally, through the large sensor sensing area.

Moreover, the obtainment unit may multiply the value by the window function that depends on a distance from a predetermined position to the sensor sensing area, and obtain the measurement data including the value multiplied by the window function.

In this way, the distribution analysis device can obtain the measurement data indicating the appropriate distribution in a desired area.

Moreover, the distribution analysis device may further include a measurement unit that measures the distribution of the field through the sensor sensing area, wherein the obtainment unit obtains the measurement data indicating the distribution measured by the measurement unit.

In this way, the distribution analysis device can directly measure the distribution of the field. The distribution analysis device can then analyze the measurement data obtained as a result of the measurement, with a high resolution.

Moreover, the distribution analysis device may further include an image processing unit that generates an image that shows the distribution indicated by the analysis data calculated by the calculation unit.

In this way, electronic component failure analysis, medical diagnosis, infrastructure inspection, and the like can be performed with a high resolution.

Advantageous Effects of Invention

According to the present invention, it is possible to analyze a distribution of a magnetic field, an electric field, or the like with a higher spatial resolution even in the case where a sensor sensing area is large.

DESCRIPTION OF EMBODIMENTS

Figure 1:
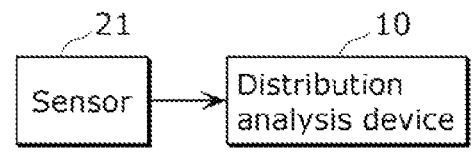
FIG. 1 is a diagram schematically showing a distribution analysis device according to Embodiment 1.

The following describes embodiments of the present invention with reference to drawings. Note that the same structural elements or the same type of structural elements are given the same reference sign in the drawings.

The embodiments described below show preferred examples of the present invention. The numerical values, shapes, materials, structural elements, the arrangement and connection of the structural elements, steps, the processing order of the steps etc. shown in the following embodiments are mere examples, and do not limit the scope of the present invention. Of the structural elements in the embodiments described below, the structural elements not recited in any one of the independent claims representing the broadest concepts of the present invention are described as arbitrary structural elements constituting desirable embodiments.

Embodiment 1

FIG. 1 is a diagram schematically showing a distribution analysis device according to Embodiment 1. In FIG. 1, a sensor 21 measures a distribution of a field (field to be analyzed). A distribution analysis device 10 analyzes the distribution of the field, from measurement data obtained by the sensor 21. Here, the distribution analysis device 10 calculates, from the measurement data, analysis data indicating the spatial distribution with a higher spatial resolution than the spatial distribution indicated by the measurement data. The calculated analysis data may be processed into an image, or the analysis data itself may be output. The distribution analysis device 10 may include the sensor 21.

The field to be analyzed has a property satisfying the Laplace equation. The Laplace equation is given by Expression 1. In Expression 1, F(x, y, z) is a function satisfying the Laplace equation, and is also called "harmonic function". Moreover, Δ in Expression 1 is called "Laplacian".

[Math. 5]

$$\frac{\partial^2}{\partial x^2}F(x, y, z) + \frac{\partial^2}{\partial y^2}F(x, y, z) + \frac{\partial^2}{\partial z^2}F(x, y, z) = 0 \quad \text{(Expression 1)}$$
$$\nabla^2 F(x, y, z) = 0$$
$$\Delta F(x, y, z) = 0.$$

The field having the property satisfying the Laplace equation is a magnetic field in a location where there is no electric current or spontaneous magnetization, an electric field in a location where there is no electric charge, a thermal field in a steady state, or the like, and the location is called "free space". The distribution analysis device 10 analyzes the distribution of such a field, to calculate the analysis data. Though this embodiment and the subsequent embodiments are based on an assumption that the field is a magnetic field, the field is not limited to a magnetic field so long as it has the property satisfying the Laplace equation as mentioned above.

Figure 2:
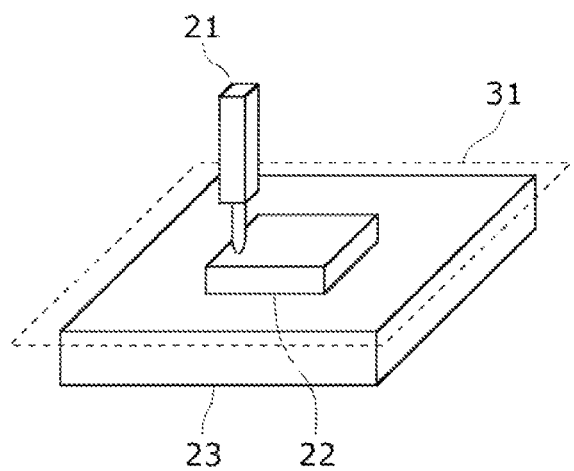
FIG. 2 is a diagram showing a state when using a sensor according to Embodiment 1.

FIG. 2 is a diagram showing a state when using the sensor 21 shown in FIG. 1. The sensor 21 measures a magnetic field around an inspection object 22 placed on a stage 23. Here, the sensor 21 measures the magnetic field along a measurement plane 31.

In more detail, the sensor 21 sequentially measures the magnetic field through a sensor sensing area that includes part of the measurement plane 31. The sensor sensing area is an area for sensing the magnetic field, and has a finite size. The sensor 21 measures the magnetic field along the measurement plane 31 while moving. Alternatively, the stage 23 may be moved to relatively move the sensor 21 and the sensor sensing area.

The distribution analysis device 10 obtains the measurement data of the magnetic field from the sensor 21. The distribution analysis device 10 calculates the analysis data from the measurement data.

The analysis data calculated by the distribution analysis device 10 is typically used for generation of a two-dimensional image. It is therefore desirable that the sensor 21 measures the magnetic field along the measurement plane 31 as shown in FIG. 2. This enables the distribution analysis device 10 to calculate the analysis data suitable for generation of a two-dimensional image along the measurement plane 31, from the measurement data along the measurement plane 31 which is a flat surface. The two-dimensional image generation mentioned here is merely an example, and the analysis data may be used for generation of a three-dimensional image.

The inspection object 22 is LSI (Large Scale Integration), as an example. In this case, the distribution analysis device 10 can calculate the analysis data indicating an electronic circuit wiring defect, from the information of the magnetic field around the inspection object 22. Then, since LSI wires are very small, image information with a high spatial resolution is needed.

Figure 3:
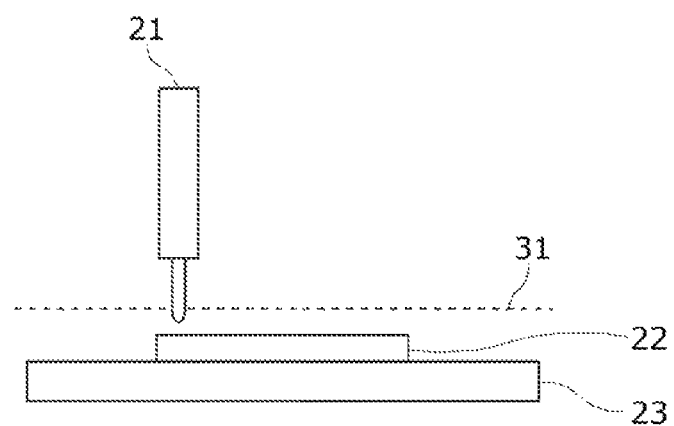
FIG. 3 is a diagram showing a side view of the state when using the sensor according to Embodiment 1.

FIG. 3 is a diagram showing a side view of the state shown in FIG. 2. As shown in FIG. 3, the inspection object 22 is placed on the stage 23, and the measurement plane 31 is situated above the inspection object 22. The sensor 21 measures the magnetic field along the measurement plane 31. The sensor 21 has the sensor sensing area for measuring the magnetic field in the measurement plane 31. Thus, the sensor 21 measures the magnetic field around the inspection object 22.

Figure 4:
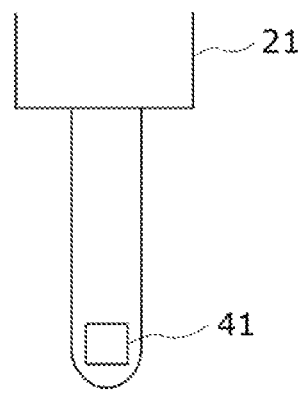
FIG. 4 is a diagram showing a sensor sensing area of the sensor according to Embodiment 1.

FIG. 4 is a diagram showing the sensor sensing area of the sensor 21 shown in FIG. 1. A sensor sensing area 41 is provided at the tip of the sensor 21. The sensor 21 measures the magnetic field in the sensor sensing area 41.

The sensor sensing area 41 has a finite size. The sensor 21 generates a signal from the magnetic field in the whole sensor sensing area 41. That is, the sensor 21 obtains information of the magnetic field integrated (aggregated) in the size of the sensor sensing area 41. It is therefore difficult for the sensor 21 to measure the spatial distribution of the magnetic field with a finer spatial resolution than the size of the sensor sensing area 41.

For example, the sensor 21 measures the magnetic field along the measurement plane 31. Actually, however, the sensor 21 measures the magnetic field in an area that includes an area above or below the measurement plane 31, based on the size of the sensor sensing area 41. This makes it difficult to directly obtain the image information relating to the distribution of the magnetic field with a high spatial resolution, from the measurement data of the sensor 21. Accordingly, the distribution analysis device 10 calculates the analysis data indicating the spatial distribution (e.g. magnetic field distribution) with a high spatial resolution, using a predetermined arithmetic expression.

Figure 5:
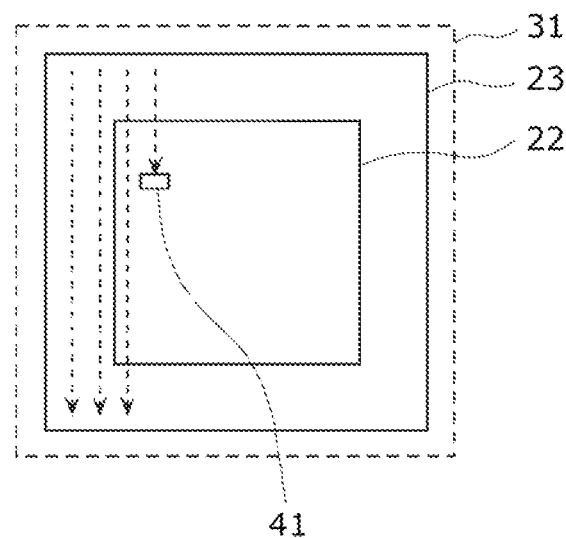
FIG. 5 is a diagram showing a top view of the state when using the sensor according to Embodiment 1.

FIG. 5 is a diagram showing a top view of the state shown in FIG. 2. As shown in FIG. 5, the sensor 21 moves so that the sensor sensing area 41 scans the measurement plane 31. While moving, the sensor 21 measures the magnetic field in the sensor sensing area 41, at each position in the measurement plane 31. The whole information in the measurement plane 31 is obtained in this way.

Figure 6:
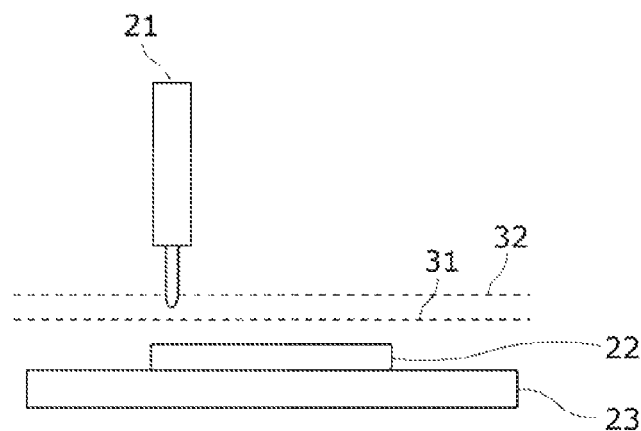
FIG. 6 is a diagram showing a state when measuring different measurement planes by the sensor according to Embodiment 1.

FIG. 6 is a diagram showing a state when measuring different measurement planes by the sensor 21 shown in FIG. 1. In FIG. 6, the sensor 21 measures the magnetic field along a measurement plane 32 above the measurement plane 31 shown in FIG. 3. Thus, the sensor 21 may measure the magnetic field in a plurality of measurement planes. This enables the sensor 21 to measure the distribution of the magnetic field in a three-dimensional space. The distribution analysis device 10 may also calculate the distribution of the magnetic field inside the inspection object 22, based on the distribution of the magnetic field in the plurality of measurement planes.

Moreover, the sensor 21 may measure the magnetic field so that the sensor sensing area 41 partially overlaps between when measuring the measurement plane 31 and when measuring the measurement plane 32. The distribution analysis device 10 may execute computation such as averaging on the information obtained in this way.

Figure 7:
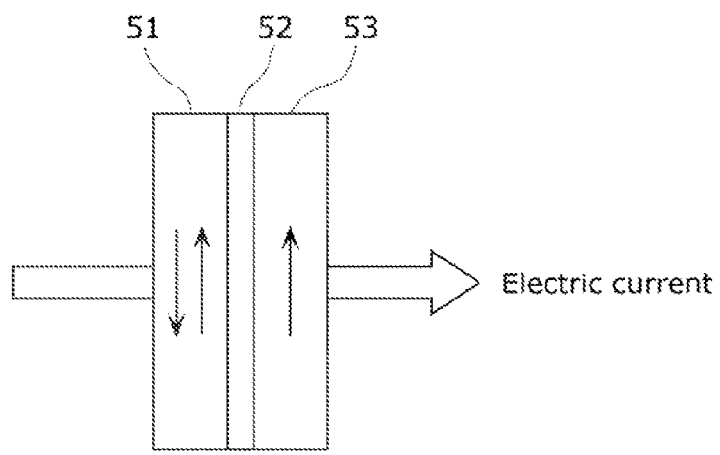
FIG. 7 is a diagram schematically showing an example of a structure of the sensor according to Embodiment 1.

FIG. 7 is a diagram schematically showing an example of a structure of the sensor 21 shown in FIG. 1. FIG. 7 specifically shows the part corresponding to the sensor sensing area 41 of the sensor 21. An example of a tunneling magnetoresistive (TMR) element is shown in FIG. 7.

In the TMR element, an insulating film layer is sandwiched between magnetic thin films of about 10 nm to 100 nm. In more detail, the TMR element is composed of three thin films that are a soft layer 51, a tunneling layer 52, and a pin layer (magnetization fixed layer) 53. The soft layer 51 is made of a magnetic material whose direction of magnetization varies according to the direction of magnetization of the external world. The pin layer 53 is made of a magnetic material whose direction of magnetization does not vary. The tunneling layer 52 is an insulating film.

The electric resistance differs between when the direction of magnetization in the soft layer 51 and the direction of magnetization in the pin layer 53 are the same and when the direction of magnetization in the soft layer 51 and the direction of magnetization in the pin layer 53 are different. Such changes in electric resistance are utilized to measure the magnetic field.

With the use of the above-mentioned property, the sensor 21 measures the magnetic field in the sensor sensing area 41. The sensor 21 may be an element other than the TMR element, such as a giant magnetoresistive (GMR) element. In the case where other elements such as a SQUID element are used, too, the sensor 21 can measure the magnetic field in the sensor sensing area 41.

Figure 8:
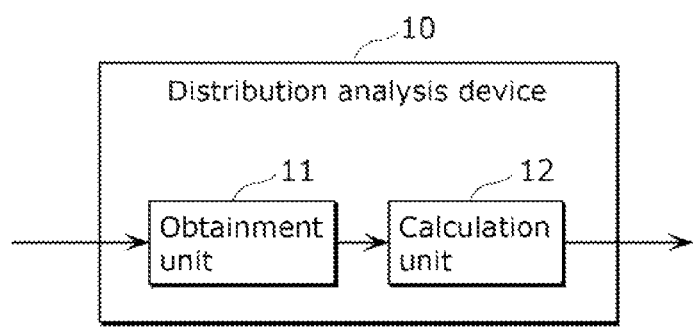
FIG. 8 is a diagram showing a structure of the distribution analysis device according to Embodiment 1.

FIG. 8 is a diagram showing a structure of the distribution analysis device 10 shown in FIG. 1. The distribution analysis device 10 shown in FIG. 8 analyzes the distribution of the field in the three-dimensional space. The distribution analysis device 10 includes an obtainment unit 11 and a calculation unit 12.

The obtainment unit 11 obtains the measurement data indicating the distribution measured through the sensor sensing area 41. For example, upon measuring the distribution, the sensor sensing area 41 is positioned so as to include part of the measurement plane 31 which is perpendicular to a predetermined Z direction. The obtainment unit 11 may obtain the measurement data from the sensor 21 that measures the distribution through the sensor sensing area 41. Alternatively, the obtainment unit 11 may obtain the same measurement data from another simulation device.

The calculation unit 12 calculates, based on the measurement data, the analysis data indicating the distribution of the magnetic field, the electric field, or the like with a higher spatial resolution than the spatial distribution indicated by the measurement data. That is, the calculation unit 12 can calculate a structure included in a space smaller than the size of the sensor sensing area 41, from the spatial distribution indicated by the measurement data obtained in the sensor sensing area 41. The calculated structure may be imaged.

The calculation unit 12 exactly calculates the solution of the Laplace equation, using a boundary condition that the integral of the solution of the Laplace equation in a finite interval corresponding to the size of the sensor sensing area 41 matches the measurement data. The analysis data obtained as a result is accurate and unique. Moreover, the calculation unit 12 can calculate the analysis data regardless of the position of the sensor sensing area 41 and the position of the magnetic field source.

For example, even in the case where the sensor sensing area 41 is positioned between two magnetic field sources, the calculation unit 12 calculates the analysis data mathematically exactly. There are instances where not only the magnetic field source to be analyzed but also another magnetic field source such as an electronic circuit or a sensor driver is present around the sensor sensing area 41. The calculation unit 12 calculates the analysis data mathematically exactly, at whichever positions magnetic field sources are present.

Figure 9:
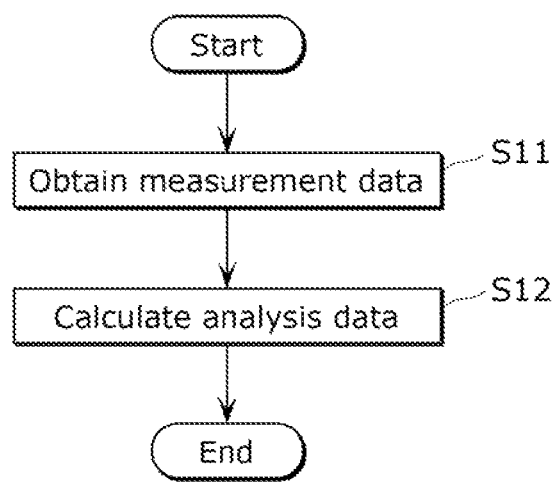
FIG. 9 is a flowchart showing an operation of the distribution analysis device according to Embodiment 1.

FIG. 9 is a flowchart showing an operation of the distribution analysis device 10 shown in FIG. 8. First, the obtainment unit 11 obtains the measurement data measured through the sensor sensing area 41 for sensing the field (Step S11). Next, the calculation unit 12 calculates the analysis data higher in spatial resolution than the measurement data, using the arithmetic expression that is obtained by calculating the solution of the Laplace equation using the measurement data as the boundary condition (Step S12).

In this way, the distribution analysis device 10 can obtain the analysis data higher in spatial resolution than the measurement data, even in the case where the sensor sensing area 41 is large.

Figure 10:
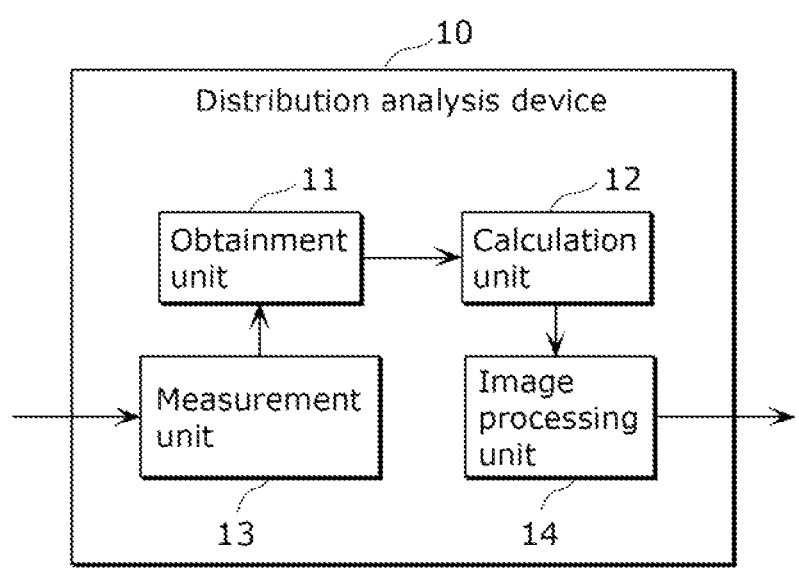
FIG. 10 is a diagram showing a structure of a variation of the distribution analysis device according to Embodiment 1.

FIG. 10 is a diagram showing a structure of a variation of the distribution analysis device 10 shown in FIG. 8. The distribution analysis device 10 shown in FIG. 10 includes the obtainment unit 11, the calculation unit 12, a measurement unit 13, and an image processing unit 14. Thus, the distribution analysis device 10 shown in FIG. 10 additionally includes the measurement unit 13 and the image processing unit 14.

The measurement unit 13 measures the distribution of the field through the sensor sensing area 41. For example, the measurement unit 13 is composed of a sensor, a probe, or the like. The measurement unit 13 may be the sensor 21 shown in FIG. 1. The sensor sensing area 41 includes part of the measurement plane 31. The sensor sensing area 41 may be an area inside the measurement unit 13, or an area outside the measurement unit 13. The obtainment unit 11 obtains the measurement data from the measurement unit 13.

The image processing unit 14 generates the image corresponding to the distribution of the field, using the analysis data calculated by the calculation unit 12. The generated image is displayed on an external display device or the like. Alternatively, the distribution analysis device 10 may include a display unit that displays the generated image.

Figure 11:
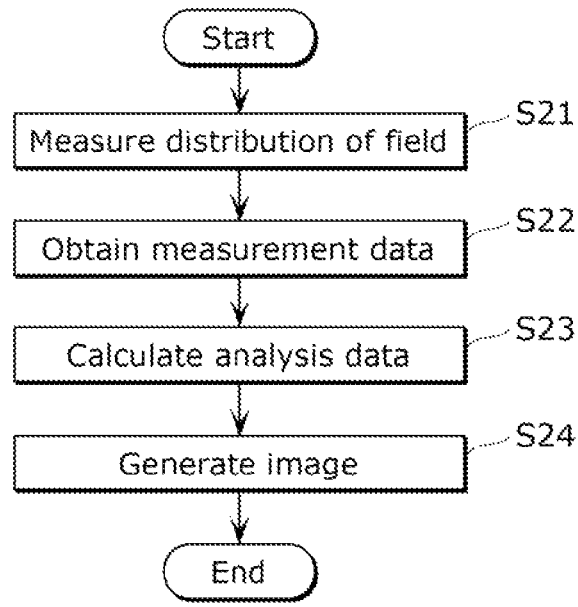
FIG. 11 is a flowchart showing an operation of the variation of the distribution analysis device according to Embodiment 1.

FIG. 11 is a flowchart showing an operation of the distribution analysis device 10 shown in FIG. 10. First, the measurement unit 13 measures the distribution of the field through the sensor sensing area 41 (Step S21). Next, the obtainment unit 11 obtains the measurement data indicating the distribution measured by the measurement unit 13 (Step S22).

Following this, the calculation unit 12 calculates the analysis data indicating the distribution of the field with a higher resolution than the measurement data, based on the measurement data (Step S23). To do so, the calculation unit 12 uses the arithmetic expression that is obtained by deriving the solution of the Laplace equation using the measurement data as the boundary condition. The image processing unit 14 generates the image using the analysis data (Step S24).

Figure 12:
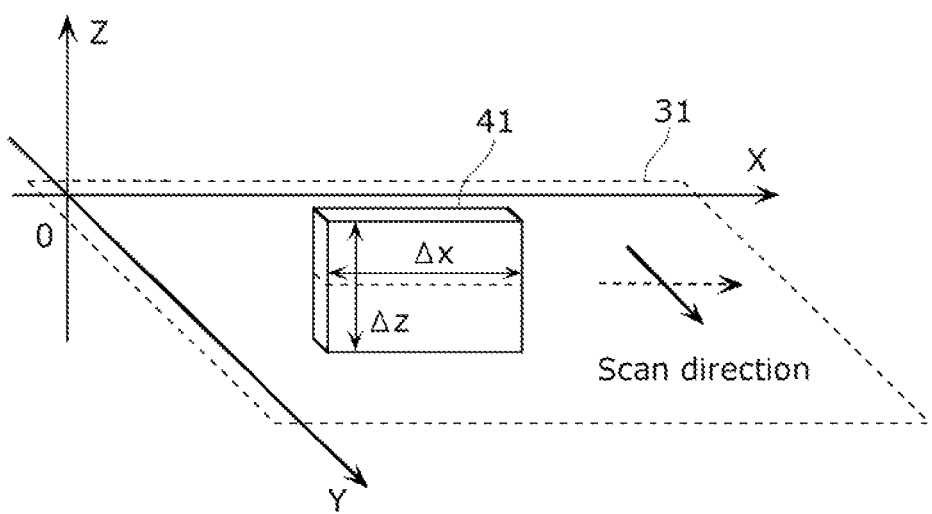
FIG. 12 is a diagram for describing an arithmetic expression according to Embodiment 1.

FIG. 12 is a diagram for describing the arithmetic expression according to Embodiment 1. The distribution of the magnetic field is measured through the sensor sensing area 41 in the three-dimensional space shown in FIG. 12. The sensor sensing area 41 has $\Delta x$ as its finite size in the X direction, and $\Delta z$ as its finite size in the Z direction. In FIG. 12, the measurement plane 31 passes through the center of the sensor sensing area 41.

The sensor sensing area 41 moves in a scan direction. As a result, the spatial distribution of the magnetic field is measured along the measurement plane 31. Actually, however, the measurement data about the measurement plane 31 is measurement data of the field sensed by the whole sensor sensing area 41 that has widths in both of the X and Z directions. This causes an error between the measurement data and the actual magnetic field distribution.

Accordingly, the calculation unit 12 calculates, with a high spatial resolution, the analysis data that does not depend on the size of the sensor sensing area 41, by using the arithmetic expression that is obtained by deriving the solution of the Laplace equation using the measurement data as the boundary condition.

The arithmetic expression used by the calculation unit 12 and an example of deriving the arithmetic expression are described below. These are based on the following precondition: the magnetic field satisfies the Laplace equation in a predetermined environment. This is described first.

The magnetic field satisfies the Maxwell equations. The Maxwell equations in the case where there is spontaneous magnetization of a ferromagnetic material or the like are given by Expression 2.

[Math. 6]

$$rotE = -\frac{\partial}{\partial t}B$$
$$rotH = j_e = \sigma E$$
$$B = \mu_0 H + \mu_0 M = \mu H$$
$$divB = 0.$$

(Expression 2)

Here, E denotes the electric field, B denotes the magnetic flux density, t denotes the time, H denotes the magnetic field, $j_e$ denotes the electric current, $\sigma$ denotes the conductivity, M denotes the magnetization, $\mu_0$ denotes the space permeability, and $\mu$ denotes the permeability. Eliminating E from Expression 2 yields a relational expression in Expression 3.

[Math. 7]

$$\nabla \times \left(\frac{1}{\sigma}\nabla \times H\right) = -\mu\frac{\partial}{\partial t}H.$$

(Expression 3)

Moreover, a relational expression in Expression 4 is obtained from Expression 2.

[Math. 8]

$$\nabla \cdot B = \nabla \cdot (\mu_0 H + \mu_0 M) = 0$$

$$\nabla \cdot H = -\nabla \cdot M$$

(Expression 4),

The left side of Expression 3 is calculated based on the result of Expression 4, as shown in Expression 5.

[Math. 9]

$$\nabla \times \left(\frac{1}{\sigma}\nabla \times H\right) = \nabla\left(\frac{1}{\sigma}\right) \times (\nabla \times H) +$$
$$\frac{1}{\sigma}\nabla \times (\nabla \times H)$$
$$= \nabla\left(\frac{1}{\sigma}\right) \times j_e + \frac{1}{\sigma}\{\nabla(\nabla \cdot H) - \Delta H\}$$
$$= -\frac{1}{\sigma^2}\nabla\sigma \times j_e +$$
$$\frac{1}{\sigma}\{-\nabla(\nabla \cdot M) - \Delta H\}.$$

(Expression 5)

From Expressions 3 and 5, the relationship between the magnetic field and the electric current is written as Expression 6.

[Math. 10]

$$\sigma\mu\frac{\partial}{\partial t}H - \Delta H = \frac{1}{\sigma}\nabla\sigma \times j_e + \nabla(\nabla \cdot M).$$ (Expression 6)

Based on Expression 6, the relationship between the magnetic field and the electric current in a steady state in which there is no temporal change is written as Expression 7.

[Math. 11]

$$\Delta H = -\frac{1}{\sigma}\nabla\sigma \times j_e - \nabla(\nabla \cdot M).$$ (Expression 7)

Expression 7 is an equation of a steady magnetic field by the electric current and the spontaneous magnetization. In a location where there is no electric current or spontaneous magnetization, the right side of Expression 7 is 0. In such a location, the magnetic field satisfies Expression 8.

[Math. 12]

$$\Delta H = 0$$ (Expression 8),

That is, the steady magnetic field with no electric current or spontaneous magnetization satisfies the Laplace equation. In the case where the component of the magnetic field in the Z direction is $H_z = \phi(x, y, z)$, Expression 9 holds.

[Math. 13]

$$\Delta\phi(x,y,z) = 0$$ (Expression 9),

If the exact solution of the equation in Expression 9 is derived, then the three-dimensional space distribution of the magnetic field is specified. The following describes a procedure of deriving the exact solution. First, the two-dimensional Fourier transform in the X and Y directions is performed on $\phi(x, y, z)$. The two-dimensional Fourier transform is written as Expression 10.

[Math. 14]

$$\tilde{\phi}(k_x, k_y, z) = \int_{-\infty}^{\infty}\int_{-\infty}^{\infty} e^{-ik_x x - ik_y y}\phi(x,y,z)dxdy$$ (Expression 10).

Here, $k_x$ denotes the spatial wavenumber in the X direction, and $k_y$ denotes the spatial wavenumber in the Y direction. Expression 11 is derived from Expressions 9 and 10.

[Math. 15]

$$\left(\frac{d^2}{dz^2} - k_x^2 - k_y^2\right)\tilde{\phi}(k_x, k_y, z) = 0.$$ (Expression 11)

The equation in Expression 11 is a second-order differential equation with respect to z. Accordingly, the general solution of the equation in Expression 11 is represented by Expression 12.

[Math. 15]

$$\tilde{\phi}(k_x, k_y, z) = a(k_x, k_y)e^{z\sqrt{k_x^2+k_y^2}} + b(k_x, k_y)e^{-z\sqrt{k_x^2+k_y^2}}.$$ (Expression 12)

Here, $a(k_x, k_y)$ and $b(k_x, k_y)$ are functions having $k_x$ and $k_y$ as variables. If $a(k_x, k_y)$ and $b(k_x, k_y)$ are determined, then the exact solution of the equation in Expression 9 is found by performing the two-dimensional inverse Fourier transform on Expression 12. The two-dimensional inverse Fourier transform is written as Expression 13.

[Math. 17]

$$\phi(x, y, z) = \frac{1}{(2\pi)^2}\int_{-\infty}^{\infty}\int_{-\infty}^{\infty} e^{ik_x x + ik_y y}\tilde{\phi}(k_x, k_y, z)dk_x dk_y$$

$$= \frac{1}{(2\pi)^2}\int_{-\infty}^{\infty}\int_{-\infty}^{\infty} e^{ik_x x + ik_y y}\left\{\begin{array}{l}a(k_x, k_y)e^{z\sqrt{k_x^2+k_y^2}} + \\ b(k_x, k_y)e^{-z\sqrt{k_x^2+k_y^2}}\end{array}\right\}dk_x dk_y$$ (Expression 13)

The sensor sensing area 41 has the finite size. Therefore, the sensor 21 shown in FIG. 1 is only capable of obtaining the information aggregated in the sensor sensing area 41 shown in FIG. 12. This makes it difficult to directly measure $\phi(x, y, z)$. In other words, it is difficult to directly determine the unknown functions $a(k_x, k_y)$ and $b(k_x, k_y)$ from the measurement data.

Hence, Expression 13 is integrated in the finite interval corresponding to the finite size of the sensor sensing area 41, to obtain Expression 14.

[Math. 18]

$$\phi_m(x, y, z) = \int_{z-\Delta z/2}^{z+\Delta z/2}\int_{x-\Delta x/2}^{x+\Delta x/2}\phi(x, y, z)dz_1 dx_1$$

$$= \frac{1}{(2\pi)^2}\int_{-\infty}^{\infty}\int_{-\infty}^{\infty} e^{ik_x x + ik_y y}\frac{4\sin(\Delta x k_x/2)}{k_x}\frac{\sinh(\Delta z\sqrt{k_x^2+k_y^2}/2)}{\sqrt{k_x^2+k_y^2}}\left\{\begin{array}{l}a(k_x, k_y)e^{z\sqrt{k_x^2+k_y^2}} + \\ b(k_x, k_y)e^{-z\sqrt{k_x^2+k_y^2}}\end{array}\right\}dk_x dk_y.$$ (Expression 14)

In Expression 14, $\phi_m(x, y, z)$ corresponds to the measurement data. That is, the sensor 21 can measure $\phi_m(x, y, z)$. Here, $\Delta x$ denotes the size of the sensor sensing area 41 in the X direction, and $\Delta z$ denotes the size of the sensor sensing area 41 in the Z direction. The size of the sensor sensing area 41 in the Y direction is very small and so is not taken into account. Note that the arithmetic expression in the case of taking the size in the Y direction into account is derivable by a procedure similar to the procedure according to the present invention.

Following this, the two-dimensional Fourier transform of x and y is performed on Expression 14. The two-dimensional Fourier transform is written as Expression 15. Expression 15 corresponds to the two-dimensional Fourier transformed function of the measurement data.

[Math. 19]

$$\phi_m(k_x, k_y, z) = \int_{-\infty}^{\infty}\int_{-\infty}^{\infty} e^{-ik_x x - ik_y y} \phi_m(x, y, z) dx dy$$
$$= \frac{4\sin(\Delta x k_x/2)}{k_x} \frac{\sinh\left(\Delta z \sqrt{k_x^2+k_y^2}/2\right)}{\sqrt{k_x^2+k_y^2}} \left\{ a(k_x, k_y) e^{z\sqrt{k_x^2+k_y^2}} + b(k_x, k_y) e^{-z\sqrt{k_x^2+k_y^2}} \right\}.$$

(Expression 15)

The measurement plane 31 is used as the boundary condition. The measurement plane 31 is an XY plane where z=0. For simplicity's sake, f(x, y) is defined as $f(x, y)=\phi_m(x, y, 0)$, and g(x, y) is defined as $g(x, y)=(d/dz)\phi_m(x, y, 0)$. The Fourier transformed functions of f(x, y) and g(x, y) are defined as Expression 16.

[Math. 20]

$$\tilde{f}(k_x, k_y) = \int_{-\infty}^{\infty}\int_{-\infty}^{\infty} e^{-ik_x x - ik_y y} f(x, y) dx dy = \phi_m(k_x, k_y, 0)$$
$$\tilde{g}(k_x, k_y) = \int_{-\infty}^{\infty}\int_{-\infty}^{\infty} e^{-ik_x x - ik_y y} g(x, y) dx dy = \frac{d}{dz}\phi_m(k_x, k_y, 0).$$

(Expression 16)

Expression 17 is derived from Expressions 15 and 16.

[Math. 21]

$$\tilde{f}(k_x, k_y) = \frac{4\sin(\Delta x k_x/2)\sinh\left(\Delta z \sqrt{k_x^2+k_y^2}/2\right)}{k_x\sqrt{k_x^2+k_y^2}} \left\{ \begin{array}{l} a(k_x, k_y) + \\ b(k_x, k_y) \end{array} \right\}$$
$$\tilde{g}(k_x, k_y) = \frac{4\sin(\Delta x k_x/2)\sinh\left(\Delta z \sqrt{k_x^2+k_y^2}/2\right)}{k_x}$$
$$\left\{ \begin{array}{l} a(k_x, k_y) - \\ b(k_x, k_y) \end{array} \right\}.$$

(Expression 17)

Expression 17 is a system of equations for $a(k_x, k_y)$ and $b(k_x, k_y)$. From Expression 17, Expression 18 is obtained as the solutions of $a(k_x, k)$ and $b(k_x, k_y)$

[Math. 22]

$$a(k_x, k_y) = \frac{k_x\{\tilde{f}(k_x, k_y)\sqrt{k_x^2+k_y^2} + \tilde{g}(k_x, k_y)\}}{8\sin(\Delta x k_x/2)\sinh\left(\Delta z \sqrt{k_x^2+k_y^2}/2\right)}$$

$$b(k_x, k_y) = \frac{k_x\{\tilde{f}(k_x, k_y)\sqrt{k_x^2+k_y^2} - \tilde{g}(k_x, k_y)\}}{8\sin(\Delta x k_x/2)\sinh\left(\Delta z \sqrt{k_x^2+k_y^2}/2\right)}.$$

(Expression 18)

In the above manner, the solutions of $a(k_x, k_y)$ and $b(k_x, k_y)$ are obtained from the actual measurement data. Assigning the solutions of $a(k_x, k_y)$ and $b(k_x, k_y)$ to Expression 12 leads to the arithmetic expression for calculating the analysis data that indicates the distribution with a higher spatial resolution than the spatial distribution indicated by the measurement data. The arithmetic expression as a result of the assignment is written as Expression 19.

[Math. 23]

$$\tilde{\phi}(k_x, k_y, z) = a(k_x, k_y)e^{z\sqrt{k_x^2+k_y^2}} + b(k_x, k_y)e^{-z\sqrt{k_x^2+k_y^2}}$$

$$= \frac{k_x\{\tilde{f}(k_x, k_y)\sqrt{k_x^2+k_y^2} + \tilde{g}(k_x, k_y)\}}{8\sin(\Delta x k_x/2)\sinh(\Delta z\sqrt{k_x^2+k_y^2}/2)}e^{z\sqrt{k_x^2+k_y^2}} +$$

$$\frac{k_x\{\tilde{f}(k_x, k_y)\sqrt{k_x^2+k_y^2} - \tilde{g}(k_x, k_y)\}}{8\sin(\Delta x k_x/2)\sinh(\Delta z\sqrt{k_x^2+k_y^2}/2)}e^{-z\sqrt{k_x^2+k_y^2}}$$

$$= \frac{k_x\sqrt{k_x^2+k_y^2}\cosh(z\sqrt{k_x^2+k_y^2})\tilde{f}(k_x, k_y) + k_x\sinh(z\sqrt{k_x^2+k_y^2})\tilde{g}(k_x, k_y)}{4\sin(\Delta x k_x/2)\sinh(\Delta z\sqrt{k_x^2+k_y^2}/2)}.$$

(Expression 19)

Lastly, $\phi(x, y, z)$ is calculated by Expression 20. Expression 20 is an expression representing the inverse Fourier transform, and is the same as Expression 13.

[Math. 24]

$$\phi(x, y, z) = \frac{1}{(2\pi)^2}\int_{-\infty}^{\infty}\int_{-\infty}^{\infty}e^{ik_xx+ik_yy}\tilde{\phi}(k_x, k_y, z)dk_xdk_y. \quad \text{(Expression 20)}$$

With the use of Expressions 19 and 20 derived as described above, the calculation unit 12 can calculate the analysis data with a high spatial resolution from the measurement data.

Note that the arithmetic expression and its derivation procedure described above are merely an example and may be modified. Moreover, the size of the sensor sensing area 41 in the Y direction may be included in the arithmetic expression and its derivation procedure.

By applying $\Delta x \rightarrow 0$ and $\Delta z \rightarrow 0$ to Expression 19, the solution corresponding to the infinitely small sensor sensing area 41 as in PTL 2 can be found.

In Expression 19, the sin h function increases monotonically, while the sin function has a zero point. It is therefore desirable that $k_x$ is not very large relative to given $\Delta x$. Besides, when $k_x$ and $k_y$ are large relative to given $\Delta z$, the sin h function in the denominator increases rapidly, and the right side of Expression 19 decreases rapidly. Accordingly, in PTL 2 which is based on the theory where the finite size of the sensor sensing area 41 is not taken into account, it is difficult to reconstruct the image showing the magnetic field distribution unless spatial high-frequency components are cut.

As described above, the distribution analysis device 10 according to Embodiment 1 can calculate the analysis data using the arithmetic expression. Even in the case where the sensor sensing area 41 or the like larger than the structure of the magnetic field source is used, the distribution analysis device 10 can calculate the analysis data indicating the distribution of the field with a high spatial resolution by assigning the measurement data to the arithmetic expression.

Embodiment 2

Embodiment 2 uses the same structure as the distribution analysis device 10 according to Embodiment 1 shown in FIG. 8 or 10 as an example. Moreover, the distribution analysis device 10 according to Embodiment 2 operates in the same way as the distribution analysis device 10 according to Embodiment 1 shown in FIG. 9 or 11 as an example.

The sensor sensing area 41 rotates in Embodiment 2. This further improves the spatial resolution.

Figure 13:
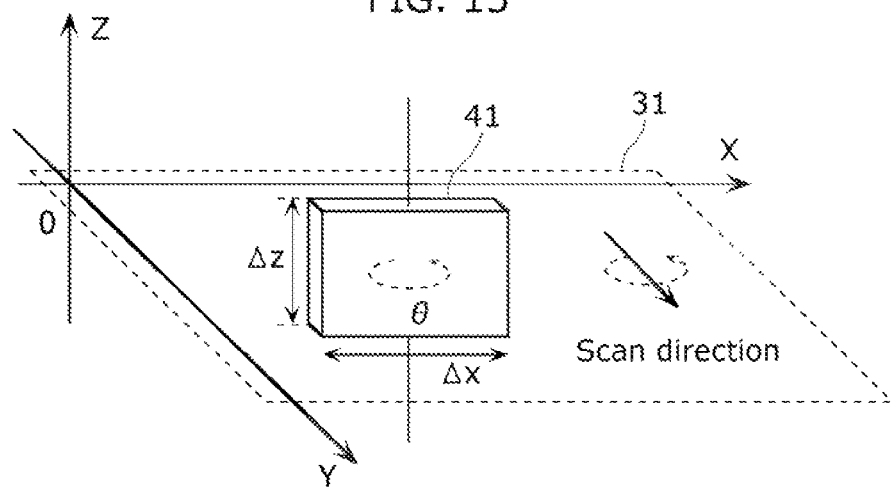
FIG. 13 is a diagram for describing an arithmetic expression according to Embodiment 2.

FIG. 13 is a diagram for describing an arithmetic expression according to Embodiment 2. The magnetic field is measured in the sensor sensing area 41 in the three-dimensional space shown in FIG. 13. The sensor sensing area 41 moves in a scan direction. As a result, the magnetic field is measured along the Y direction of the measurement plane 31.

The sensor sensing area 41 also rotates about a line parallel to the Z direction. For example, the sensor 21 shown in FIG. 2 may rotate to rotate the sensor sensing area 41. Alternatively, the sensor 21 may rotate only the sensor sensing area 41 such as a TMR element.

Moreover, the sensor 21 may rotate the scan direction. In detail, the sensor 21 may change its moving direction according to the rotation angle of the sensor sensing area 41, thereby changing the angle of the scan direction. The scan direction of the sensor 21 is desirably normal to the sensing surface of the sensor sensing area 41.

The calculation unit 12 calculates the analysis data with a high spatial resolution, using a predetermined arithmetic expression. The predetermined arithmetic expression is an arithmetic expression obtained by solving the Laplace equation using the measurement data as the boundary condition. In this arithmetic expression, the size of the sensor sensing area 41 is taken into account. The arithmetic expression is derived as follows.

First, the component of the magnetic field in the z-axis direction is denoted by $H_z = \phi(x, y, z)$, as in Embodiment 1. Expression 21 holds for the component of the magnetic field in the z-axis direction.

[Math. 25]

$$\Delta\phi(x,y,z)=0 \quad \text{(Expression 21).}$$

To find the general solution of Expression 21, the two-dimensional Fourier transform is performed on $\phi(x, y, z)$ for x and y. The two-dimensional Fourier transform is written as Expression 22.

[Math. 26]

$$\tilde{\phi}(k_x,k_y,z)=\int_{-\infty}^{\infty}\int_{-\infty}^{\infty}e^{-ik_xx-ik_yy}\phi(x,y,z)dxdy \quad \text{(Expression 22).}$$

The Fourier transformed function is written as Expression 23, as in Embodiment 1,

[Math. 27]

$$\tilde{\phi}(k_x, k_y, z) = a(k_x, k_y)e^{z\sqrt{k_x^2+k_y^2}} + b(k_x, k_y)e^{-z\sqrt{k_x^2+k_y^2}}. \quad \text{(Expression 23)}$$

Figure 14:
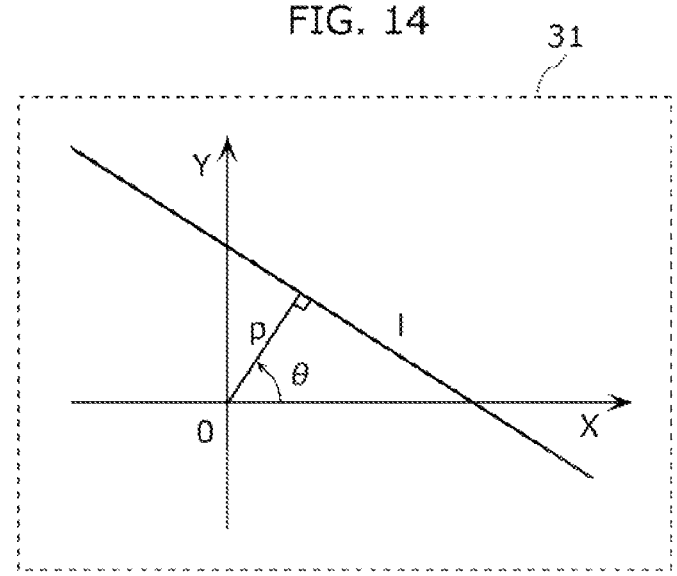
FIG. 14 is a diagram schematically showing a measurement plane according to Embodiment 2.

FIG. 14 is a diagram schematically showing the measurement plane 31 shown in FIG. 13. The sensor 21 measures the measurable field in the measurement plane 31, by the rotation of the sensor sensing area 41. A line l shown in FIG. 14 indicates the sensor sensing area 41 at a specific time. The sensor sensing area 41 can be formed as a thin film, and so is expressed as a line.

The thickness of the thin film is not taken into account here. Note that the arithmetic expression in the case of taking the thickness of the thin film into account is derivable by a procedure similar to the procedure according to the present invention. It is, however, difficult to calculate a field in a space smaller than the thickness of the thin film with high accuracy.

The sensor 21 measures the distribution of the field in the whole measurement plane 31, with the rotation of the sensor sensing area 41 (line l).

In FIG. 14, θ corresponds to the angular coordinate of the rotation of the sensor sensing area 41. Meanwhile, p corresponds to the minimum distance from the predetermined origin to the sensor sensing area 41, and corresponds to the radius distance. The line 1 is represented by x cos θ+y sin θ−p=0.

Here, (p, θ) is polar coordinate-based representation, and (p, θ, z) obtained by a combination of polar coordinates and a coordinate value in the Z direction are cylindrical coordinates. In this coordinate system, the measurement data in the sensor sensing area 41 is given by Expression 24.

[Math. 28]

$$g_{me}(p,\theta,z) = \int_{z-\Delta z}^{z+\Delta z} \iint_D \phi(x_1,y_1,z_1)\delta(x_1\cos\theta + y_1\sin\theta - p)dx_1 dy_1 dz_1 \quad \text{(Expression 24).}$$

Here, D denotes the measurement plane 31. The value on the line 1 in D is integrated by integration of the delta function (δ). Meanwhile, Δz is the size of the sensor sensing area 41 in the Z direction. Accordingly, Expression 24 is proportional to the actual measurement data. The Fourier transform of Expression 24 with respect to p is written as Expression 25.

Figure 15:
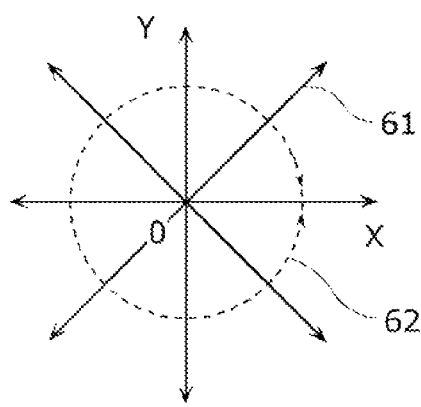
FIG. 15 is a diagram showing a direction of a radius distance according to Embodiment 2.

Here, k denotes the wavenumber in the direction of the radius distance in the polar coordinates. FIG. 15 is a diagram showing the direction of the radius distance according to Embodiment 2. A radius distance direction 61 (also referred to as "radius distance direction P" or "P direction") is shown in FIG. 15. A rotation (angular coordinate) direction 62 corresponding to the radius distance direction 61 is also shown in FIG. 15.

Note that $k_x$ which is the wavenumber in the X direction is denoted by $k_x = k \cos\theta$, using k and θ. Likewise, $k_y$ which is the wavenumber in the Y direction is denoted by $k_y = k \sin\theta$, using k and θ. Assigning them to Expression 23 yields Expression 26.

[Math. 30]

$$\tilde{\phi}(k\cos\theta, k\sin\theta) = a(k\cos\theta, k\sin\theta)e^{kz_1} + b(k\cos\theta, k\sin\theta)e^{-kz_1} \quad \text{(Expression 26).}$$

Assigning Expression 26 to Expression 25 yields Expression 27. Expression 27 corresponds to the actual measurement data.

[Math. 31]

$$\tilde{g}_{me}(k, \theta, z) = \int_{-\infty}^{\infty} e^{-ikp} g_{me}(p, \theta, z) dp \quad \text{(Expression 27)}$$

$$= \int_{z-\Delta z}^{z+\Delta z} \left\{ \begin{array}{l} a(k\cos\theta, k\sin\theta)e^{kz_1} + \\ b(k\cos\theta, k\sin\theta)e^{-kz_1} \end{array} \right\} dz_1$$

$$= \frac{2\sinh(k\Delta z/2)}{k} \left\{ \begin{array}{l} a(k\cos\theta, k\sin\theta)e^{kz} + \\ b(k\cos\theta, k\sin\theta)e^{-kz} \end{array} \right\}.$$

The measurement plane 31 is a plane where z=0, for convenience's sake. The boundary condition is given at the position of the measurement plane 31, i.e. the position of z=0. Expression 28 defines $f_m(k, \theta)$ and $g_m(k, \theta)$ which are functions indicating the measurement data given at the position of z=0.

[Math. 32]

$$f_m(k, \theta) = \int_{-\infty}^{\infty} e^{-ikp} g_{me}(p, \theta, 0) dp \quad \text{(Expression 28)}$$

$$g_m(k, \theta) = \int_{-\infty}^{\infty} e^{-ikp} \frac{d}{dz} g_{me}(p, \theta, 0) dp.$$

[Math. 29]

$$\tilde{g}_{me}(k, \theta, z) = \int_{-\infty}^{\infty} e^{-ikp} g_{me}(p, \theta, z) dp \quad \text{(Expression 25)}$$

$$= \int_{-\infty}^{\infty} e^{-ikp} \left\{ \int_{z-\Delta z}^{z+\Delta z} \iint_D \phi(x_1, y_1, z_1)\delta(x_1\cos\theta + y_1\sin\theta - p) dx_1 dy_1 dz_1 \right\} dp$$

$$= \int_{z-\Delta z}^{z+\Delta z} \iint_D \phi(x_1, y_1, z_1) e^{-ik(x_1\cos\theta + y_1\sin\theta)} dx_1 dy_1 dz_1$$

$$= \int_{z-\Delta z}^{z+\Delta z} \tilde{\phi}(k\cos\theta, k\sin\theta, z_1) dz_1.$$

Expression 29 is obtained from Expressions 27 and 28.

[Math. 33]

$$f_m(k, \theta) = \frac{2\sinh(k\Delta z/2)}{k}\{a(k\cos\theta, k\sin\theta) + b(k\cos\theta, k\sin\theta)\} \quad \text{(Expression 29)}$$

$$g_m(k, \theta) = 2\sinh(k\Delta z/2)\{a(k\cos\theta, k\sin\theta) - b(k\cos\theta, k\sin\theta)\}.$$

Expression 29 is a system of equations for a(k cos θ, k sin θ) and b(k cos θ, k sin θ). Expression 30 as the solutions of a(k cos θ, k sin θ) and b(k cos θ, k sin θ) is derived from Expression 29.

[Math. 34]

$$a(k\cos\theta, k\sin\theta) = \frac{kf_m(k, \theta) + g_m(k, \theta)}{4\sinh(k\Delta z/2)} \quad \text{(Expression 30)}$$

$$b(k\cos\theta, k\sin\theta) = \frac{kf_m(k, \theta) - g_m(k, \theta)}{4\sinh(k\Delta z/2)}.$$

The functions $f_m(k, \theta)$ and $g_m(k, \theta)$ are obtained from the actual measurement data. Assigning Expression 30 to Expression 26 yields Expression 31.

[Math. 35]

$$\tilde{\phi}(k\cos\theta, k\sin\theta, z) = \frac{kf_m(k, \theta) + g_m(k, \theta)}{4\sinh(k\Delta z/2)}e^{kz} + \frac{kf_m(k, \theta) - g_m(k, \theta)}{4\sinh(k\Delta z/2)}e^{-kz} \quad \text{(Expression 31)}$$

$$= \frac{k\cosh(kz)f_m(k, \theta) + \sinh(kz)g_m(k, \theta)}{2\sinh(k\Delta z/2)}.$$

Expression 31 corresponds to the function obtained by performing the two-dimensional Fourier transform on φ(x, y, z) in the X and Y directions. A two-dimensional Fourier transform image in the X and Y directions at arbitrary z is obtained from Expression 31. Performing the two-dimensional inverse Fourier transform on Expression 31 yields φ(x, y, z). The two-dimensional inverse Fourier transform is written as Expression 32. The calculation of Expression 32 requires transformation from polar coordinates to orthogonal coordinates in a wavenumber space.

[Math. 36]

$$\phi(x, y, z) = \frac{1}{(2\pi)^2}\int_{-\infty}^{\infty}\int_{-\infty}^{\infty}e^{ik_x x + ik_y y}\tilde{\phi}(k_x, k_y, z)dk_x dk_y \quad \text{(Expression 32)}$$

$$k_x = k\cos\theta$$

$$k_y = k\sin\theta$$

Expression 31 is an arithmetic expression obtained by solving the Laplace equation using the measurement data as the boundary condition while taking the finite size of the sensor sensing area 41 into account, as with Expression 19 in Embodiment 1. The actual measurement data can be directly assigned to this arithmetic expression. With the use of Expression 31 derived as described above, the calculation unit 12 can calculate the analysis data indicating the distribution of the field with a high spatial resolution, from the measurement data.

As described above, the distribution analysis device 10 according to Embodiment 2 can calculate the analysis data indicating the distribution of the field with a high spatial resolution, using the arithmetic expression.

Expression 19 in Embodiment 1 includes the sin function in the denominator. The denominator therefore has a zero point. This incurs a possibility that appropriate analysis data cannot be attained in the case where $k_x$ is large relative to given Δx. That is, in Embodiment 1, it is difficult to reconstruct a distribution image without cutting spatial high-frequency components. On the other hand, Expression 31 in Embodiment 2 has no sin function in the denominator. Hence, in Embodiment 2, a distribution image can be reconstructed with a high resolution without cutting spatial high-frequency components.

Embodiment 3

Embodiment 3 uses the same structure as the distribution analysis device 10 according to Embodiment 1 shown in FIG. 8 or 10 as an example. Moreover, the distribution analysis device 10 according to Embodiment 3 operates in the same way as the distribution analysis device 10 according to Embodiment 1 shown in FIG. 9 or 11 as an example. The sensor sensing area 41 according to Embodiment 3 may rotate as in Embodiment 2. Embodiment 3 describes a method for realizing local Radon transform, as an additional method to Embodiments 1 and 2.

As in Embodiments 1 and 2, the measurement unit 13 measures the distribution of the field in an area scanned by the sensor sensing area 41. Meanwhile, the distribution of the field is not measured in an area not scanned by the sensor sensing area 41. For analysis of the inspection object 22, it is desirable that the measurement unit 13 measures the distribution of the field in the surrounding area covering the inspection object 22. It is therefore desirable that the size of the sensor sensing area 41 corresponds to the size of the inspection object 22.

In the case where the size of the sensor sensing area 41 does not match the size of the inspection object 22, there is a possibility that the obtainment of the measurement data takes long time, and also there is a possibility that the measurement data cannot be obtained appropriately. In particular, in Embodiment 2, the magnetic field in the area around the inspection object 22 is typically measured by scanning so that the relatively large sensor sensing area 41 covers the inspection object 22.

Objects of various sizes are expected to be inspected as the inspection object 22, and it is difficult to physically change the size of the sensor sensing area 41 according to the size of the inspection object 22. Hence, the sensor sensing area 41 is formed in a large size beforehand. Even in the case where the inspection object 22 is small relative to the sensor sensing area 41, the magnetic field around the inspection object 22 can be measured by the sensor sensing area 41 of the large size.

In the case where the measurement unit 13 measures the distribution of the magnetic field in the sensor sensing area 41 of the large size, however, the distribution of the magnetic field in an area where the distribution of the magnetic field need not be measured is measured, too. This may cause the analysis of the distribution of the magnetic field to take long time. Besides, there is a possibility that the appropriate distribution cannot be obtained due to unnecessary magnetic field information.

In view of this, in Embodiment 3, a window function is used to amplify the necessary part of the measurement data and attenuate the unnecessary part of the measurement data. This reduces the time required to analyze the distribution of the magnetic field. In addition, the appropriate distribution is obtained locally. The Radon transform for locally generating the three-dimensional image is possible based on the locally obtained distribution.

In more detail, the obtainment unit 11 multiplies the value of the field sensed in the sensor sensing area 41, by the window function. The obtainment unit 11 obtains the measurement data including the value multiplied by the window function. The window function may be a function that depends on the distance from a predetermined position to the sensor sensing area 41.

Figure 16:
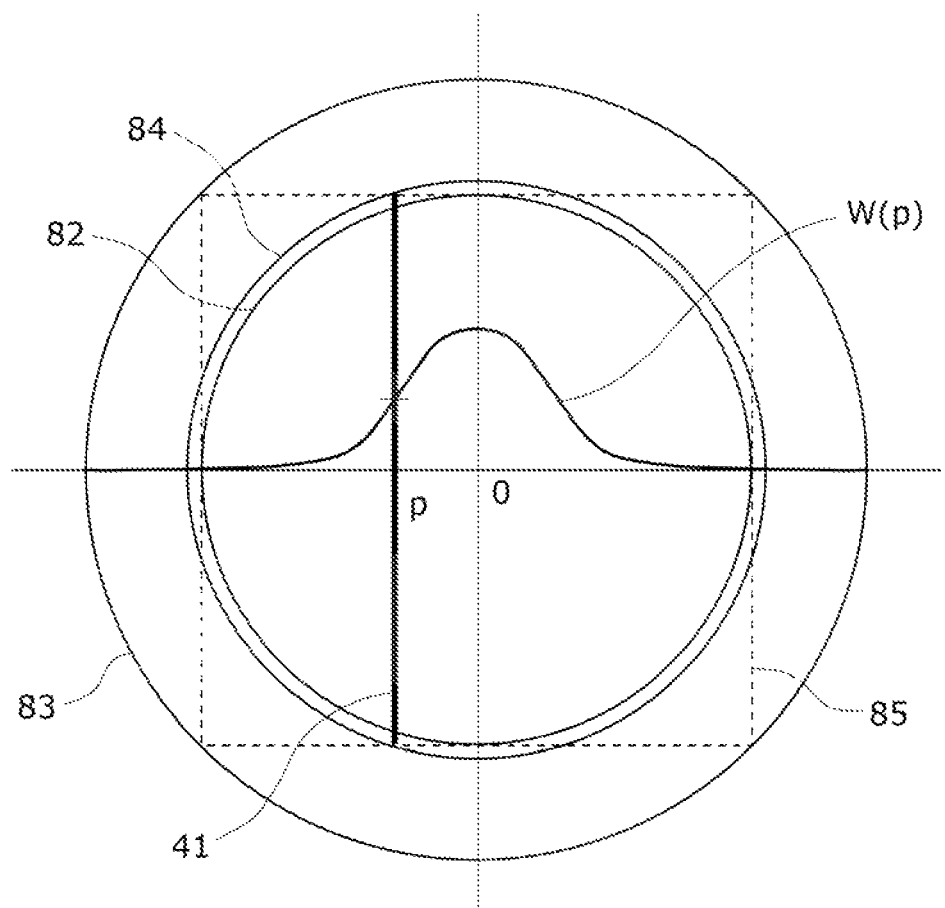
FIG. 16 is a diagram schematically showing an example of an analysis area according to Embodiment 3.

FIG. 16 is a diagram schematically showing an example of an analysis area according to Embodiment 3. FIG. 16 corresponds to the top view of the measurement plane 31. The sensor sensing area 41 scans a scan area 85. The inspection object 22 is placed below the measurement plane 31, though not shown in FIG. 16.

For instance, the inspection object 22 is placed on a rotary stage, and an area around the inspection object 22 is scanned in a plurality of directions. As an example, a state in which the inspection object 22 rotates at −θ corresponds to a state in which the sensor sensing area 41 rotates at θ. Thus, the measurement data of the distribution of the magnetic field is obtained as in Embodiment 2.

Moreover, for example, the inspection object 22 is placed below an analysis area 82 in the measurement plane 31. The analysis area 82 is included in a measurement area 83. In Embodiment 3, the measurement unit 13 measures the distribution of the magnetic field in the measurement area 83. The obtainment unit 11 obtains the measurement data indicating the measured distribution. The calculation unit 12 analyzes the distribution of the magnetic field in the analysis area 82, based on the measurement data. In the series of these processes, unnecessary data is removed from the measurement data by a window function w(p).

The window function w(p) is schematically shown in FIG. 16. Here, p denotes the radius distance. When the absolute value of p is smaller, the window function w(p) indicates a larger value. When the absolute value of p is larger, the window function w(p) indicates a smaller value. In p outside the range of the analysis area 82, the window function w(p) converges to 0. Data outside the analysis area 82 is excluded from the measurement data by multiplying the measurement data by the window function w(p). The size of the analysis area 82 varies according to the window function w(p).

A half width area 84 is an area that influences the analysis of the distribution of the magnetic field even in the case where the measurement data is multiplied by the window function w(p). The half width area 84 is an area corresponding to the half width of the window function w(p). However, for example in the case where the length of the sensor sensing area 41 is 1000 µm and the diameter of the analysis area 82 is 100 µm, the window function w(p) is sharper than the example in FIG. 16, so that the influence is small.

An example of a specific procedure of multiplying the measurement data by the window function w(p) is described below. First, the value of the magnetic field sensed in the sensor sensing area 41 is given by Expression 33.

[Math. 37]

$$g(p,\theta) = \iint_D H_z(x,y)\delta(x\cos\theta + y\sin\theta - p)dxdy \quad \text{(Expression 33)}.$$

In Expression 33, g(p, θ) denotes the function corresponding to the magnetic field sensed in the sensor sensing area 41, p denotes the radius distance, θ denotes the angular coordinate, D denotes the plane, $H_z(x, y)$ denotes the magnetic field, x denotes the coordinate value in the X direction, and y denotes the coordinate value in the Y direction. A relational expression obtained by multiplying g(p, θ) by the window function and Fourier transforming the result in the P direction is shown in Expression 34.

[Math. 38]

(Expression 34)

$$G(k,\theta) = \int_{-\infty}^{\infty} e^{-ikp} w(p) g(p,\theta) dp$$

$$= \int\!\!\int_D H_z(x,y) e^{-ik(x\cos\theta + y\sin\theta)} w(x\cos\theta + y\sin\theta) dxdy.$$

Here, G(k, θ) denotes the function obtained by the Fourier transform in the P direction, and k denotes the wavenumber in the P direction. An approximate expression in Expression 35 holds for w(x cos θ, y sin θ) in Expression 34.

[Math. 39]

$$w(x\cos\theta + y\sin\theta) = w\!\left(\sqrt{x^2+y^2}\cos(\theta-\alpha)\right) \quad \text{(Expression 35)}$$

$$\approx w\!\left(\frac{1}{\sqrt{2}}\sqrt{x^2+y^2}\right)$$

$$= w'(x,y).$$

To simplify the arithmetic expression, Expression 35 is applied to Expression 34. This leads to a relational expression in Expression 36.

[Math. 40]

$$G(k,\theta) \approx \int\!\!\int_D H_z(x,y) e^{-ikx\cos\theta - iky\sin\theta} w'(x,y) dxdy \quad \text{(Expression 36)}$$

$$= \int\!\!\int_D H_z(x,y) e^{-ik_x x - ik_y y} w'(x,y) dxdy$$

$$= FT[w' H_z](k_x, k_y).$$

Inverse Fourier transforming Expression 36 yields w'(x, y)$H_z$(x, y). That is, multiplying the value sensed in the sensor sensing area 41 by the window function w(p) is equivalent to multiplying the distribution of the magnetic field by the window function w(p). As a result, in the measurement area 83, the measurement data of the magnetic field in the analysis area 82 is amplified and the measurement data of the magnetic field in the other area is attenuated.

The measurement data multiplied by the window function w(p) is analyzed using the arithmetic expression derived in Embodiment 2 or the like. In this way, the analysis data indicating the highly accurate distribution locally can be attained with low computational complexity.

Note that, when the measurement data multiplied by the window function w(p) is divided by the window function w(p), the original measurement data is obtained excluding the part in which the window function w(p) is 0. Here, a window function w'(x, y) may be used as the divisor. The measurement data divided by the window function w(p) or the window function w'(x, y) may be analyzed using the arithmetic expression derived in Embodiment 2 or the like.

The window function w(p) and its calculation described above are merely an example. For instance, such a window function w(p) that amplifies the information of the magnetic field in a position other than the center of the measurement area 83 may be used. Besides, the window function w(p) may be a window function called "rectangular window".

Though the method described in Embodiment 3 mainly corresponds to Embodiment 2, the same concept may be applied to Embodiment 1. Furthermore, the method described in Embodiment 3 is not limited to the use with Embodiment 1 or 2, and may be independently employed as a method of obtaining appropriate measurement data locally.

Embodiment 4

Embodiment 4 describes a first application example of the distribution analysis device 10 in each of Embodiments 1 to 3.

Figure 17:
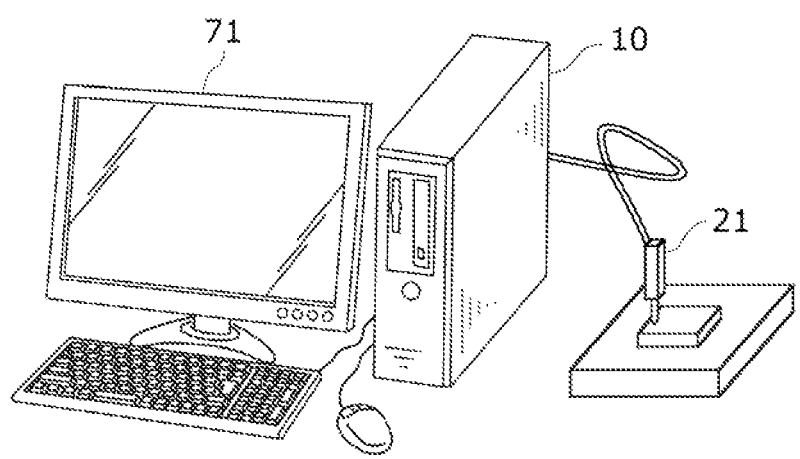
FIG. 17 is a diagram showing a distribution analysis device according to Embodiment 4.

FIG. 17 is a diagram showing the distribution analysis device 10 according to Embodiment 4. The distribution analysis device 10 shown in FIG. 17 is a computer such as a personal computer (PC). The distribution analysis device 10 includes a CPU (Central Processing Unit), a memory, an input-output interface, and the like.

The distribution analysis device 10 obtains the measurement data from the sensor 21. The distribution analysis device 10 calculates the analysis data having a higher spatial resolution from the measurement data, using the predetermined arithmetic expression. The distribution analysis device 10 then displays the analysis data on a display device 71. The distribution analysis device 10 is thus applicable to a computer such as a personal computer.

Embodiment 5

Embodiment 5 describes a second application example of the distribution analysis device 10 in each of Embodiments 1 to 3.

Figure 18:
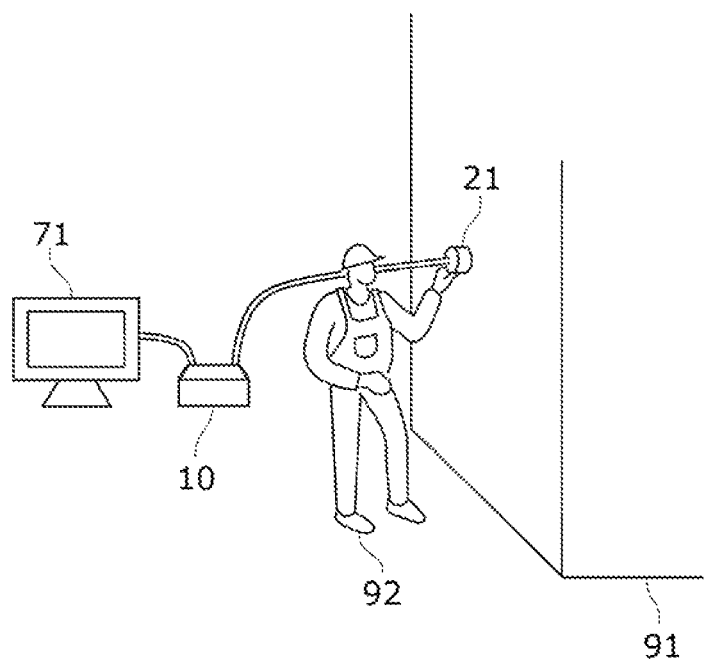
FIG. 18 is a diagram showing a distribution analysis device according to Embodiment 5.

FIG. 18 is a diagram showing the distribution analysis device 10 according to Embodiment 5. The distribution analysis device 10 shown in FIG. 18 analyzes a distribution of a magnetic field inside an inspection object 91. For example, the inspection object 91 is a reinforced concrete building.

An operator 92 measures a magnetic field inside and around the inspection object 91, using the sensor 21. The distribution analysis device 10 obtains the measurement data from the sensor 21. The distribution analysis device 10 calculates the analysis data of high accuracy from the measurement data, using the predetermined arithmetic expression. The distribution analysis device 10 then displays the analysis data on the display device 71.

Thus, the operator 92 can use the distribution analysis device 10 for concrete rebar corrosion inspection.

Though the distribution analysis device according to the present invention has been described above by way of the embodiments, the present invention is not limited to these embodiments. Other embodiments realized by application of modifications conceivable by those skilled in the art to the embodiments and any combinations of the structural elements in the embodiments are also included in the present invention.

For example, a process executed by a specific processing unit may be executed by another processing unit. Processes may be executed in different order, and two or more processes may be executed in parallel.

The present invention may be realized not only as the distribution analysis device, but also as a method including steps corresponding to the processing units included in the distribution analysis device. For example, these steps are executed by a computer. The present invention may also be realized as a program for causing the computer to execute the steps included in the method. The present invention may further be realized as a non-transitory computer-readable recording medium such as a CD-ROM on which the program is recorded.

The structural elements included in the distribution analysis device may be realized by LSI which is an integrated circuit. The structural elements may each be individually implemented as one chip, or may be partly or wholly implemented on one chip. Though LSI is mentioned here, the integrated circuit may be called an IC (Integrated Circuit), system LSI, super LSI, ultra LSI, or the like, depending on the degree of integration.

The integrated circuit method is not limited to LSI, and may be realized by a dedicated circuit or a general-purpose processor. An FPGA (Field Programmable Gate Array) which can be programmed or a reconfigurable processor which is capable of reconfiguring connections and settings of circuit cells in LSI may be used.

When an integrated circuit technology that replaces LSI emerges from development of semiconductor technologies or other derivative technologies, such a technology may be used to create integrated circuits of the structural elements included in the distribution analysis device.

INDUSTRIAL APPLICABILITY

The distribution analysis device according to the present invention is capable of analyzing distributions of various fields, and can be used for, for example, magnetic field diagnostic equipment, electronic component inspection, concrete rebar corrosion inspection, seismic qualification test for steel structures in earthquake-stricken regions, and medical diagnosis.

REFERENCE SIGNS LIST

10 Distribution analysis device
11 Obtainment unit
12 Calculation unit
13 Measurement unit
14 Image processing unit
21 Sensor
22, 91 Inspection object
23 Stage
31, 32 Measurement plane
41 Sensor sensing area
51 Soft layer
52 Tunneling layer
53 Pin layer (magnetization fixed layer)
61, 62 Direction
71 Display device
82 Analysis area
83 Measurement area 84 Half width area
85 Scan area
92 Operator

The invention claimed is:

1. A distribution analysis device that analyzes a distribution of a field having a property satisfying the Laplace equation, the distribution analysis device comprising:
an obtainment unit configured to obtain measurement data indicating the distribution of the field measured through a sensor sensing area, the sensor sensing area being an area that moves in a measurement area where the distribution of the field is measured and being an area in which the field is sensed as an aggregate; and
a calculation unit configured to calculate analysis data indicating the distribution of the field with a higher resolution than the measurement data, using an arithmetic expression that is obtained by deriving a solution of the Laplace equation using a boundary condition that an integral of the solution of the Laplace equation in a finite interval corresponding to a size of the sensor sensing area matches the measurement data,
wherein the obtainment unit is configured to obtain the measurement data indicating the distribution measured through the sensor sensing area that rotates about a line parallel to a predetermined Z direction, and
in the case where: a three-dimensional space is represented by cylindrical coordinates using z that denotes a coordinate value in the Z direction, θ that denotes an angular coordinate, and p that denotes a radius distance; k denotes a wavenumber in a P direction which is a direction of the radius distance; Δz denotes the size of the sensor sensing area in the Z direction: $g_{me}(p, \theta, z)$ denotes the measurement data when the coordinate value in the Z direction is z; $f_m(k, \theta)$ denotes a function as a result of Fourier transforming $g_{me}(p, \theta, z)$ in the P direction when z in $g_{me}(p, \theta, z)$ is 0; and $g_m(k, \theta)$ denotes a function as a result of Fourier transforming, in the P direction, a function obtained by assigning 0 to z in a function obtained by differentiating $g_{me}(p, \theta, z)$ with respect to z, the calculation unit is configured to calculate the analysis data using $$\frac{k\cosh(kz)f_m(k, \theta) + \sinh(kz)g_m(k, \theta)}{2\sinh(k\Delta z/2)} \qquad [\text{Math. 1}]$$

as the arithmetic expression.

2. The distribution analysis device according to claim 1, wherein the obtainment unit is configured to obtain the measurement data indicating the distribution of the field that is any of a magnetic field, an electric field, and a thermal field, and
the calculation unit is configured to calculate the analysis data indicating the distribution of the field.

3. The distribution analysis device according to claim 1, wherein the obtainment unit is configured to obtain the measurement data indicating the distribution of the field measured through the sensor sensing area that intersects a measurement plane, the measurement plane being a plane perpendicular to the Z direction, and
the calculation unit is configured to calculate the analysis data, using the arithmetic expression that is obtained by deriving the solution of the Laplace equation using the boundary condition that the integral of the solution of the Laplace equation in the finite interval corresponding to the size of the sensor sensing area in the Z direction matches the measurement data.

4. A distribution analysis device that analyzes a distribution of a field having a property satisfying the Laplace equation, the distribution analysis device comprising:
an obtainment unit configured to obtain measurement data indicating the distribution of the field measured through a sensor sensing area, the sensor sensing area being an area that moves in a measurement area where the distribution of the field is measured and being an area in which the field is sensed as an aggregate; and
a calculation unit configured to calculate analysis data indicating the distribution of the field with a higher resolution than the measurement data, using an arithmetic expression that is obtained by deriving a solution of the Laplace equation using a boundary condition that an integral of the solution of the Laplace equation in a finite interval corresponding to a size of the sensor sensing area matches the measurement data,
wherein in the case where, in a three-dimensional space including mutually perpendicular X, Y, and Z directions: z denotes a coordinate value in the Z direction; $k_x$ denotes a wavenumber in the X direction; $k_y$ denotes a wavenumber in the Y direction; Δx denotes the size of the sensor sensing area in the X direction; Δz denotes the size of the sensor sensing area in the Z direction; $\phi_m(x, y, z)$ denotes the measurement data when the coordinate value in the Z direction is z; f(x, y) denotes the measurement data when z in $\phi_m(x, y, z)$ is 0; g(x, y) denotes a function obtained by assigning 0 to z in a function obtained by differentiating $\phi_m(x, y, z)$ with respect to z;

$$\tilde{f}(k_x, k_y) \qquad [\text{Math. 2}]$$

denotes a function as a result of Fourier transforming f(x, y) in the X and Y directions; and $$\tilde{g}(k_x, k_y) \qquad [\text{Math. 3}]$$

denotes a function as a result of Fourier transforming g(x, y) in the X and Y directions, the calculation unit is configured to calculate the analysis data using $$\frac{k_x\sqrt{k_x^2 + k_y^2}\cosh\left(z\sqrt{k_x^2 + k_y^2}\right)\tilde{f}(k_x, k_y) + k_x\sinh\left(z\sqrt{k_x^2 + k_y^2}\right)\tilde{g}(k_x, k_y)}{4\sin(\Delta x k_x/2)\sinh\left(\Delta z\sqrt{k_x^2 + k_y^2}/2\right)} \qquad [\text{Math. 4}]$$

as the arithmetic expression.

5. The distribution analysis device according to claim 1, wherein the obtainment unit is configured to multiply a value of the field sensed in the sensor sensing area by a window function, and obtain the measurement data including the value multiplied by the window function.

6. The distribution analysis device according to claim 5, wherein the obtainment unit is configured to multiply the value by the window function that depends on a distance from a predetermined position to the sensor sensing area, and obtain the measurement data including the value multiplied by the window function.

7. The distribution analysis device according to claim 1, further comprising
a measurement unit configured to measure the distribution of the field through the sensor sensing area, wherein the obtainment unit is configured to obtain the measurement data indicating the distribution measured by the measurement unit.

8. The distribution analysis device according to claim 1, further comprising
an image processing unit configured to generate an image that shows the distribution indicated by the analysis data calculated by the calculation unit.

* * * * *